United States Patent
Kang et al.

(10) Patent No.: US 11,770,658 B2
(45) Date of Patent: Sep. 26, 2023

(54) SENSOR INTERFACE INCLUDING RESONATOR AND DIFFERENTIAL AMPLIFIER

(71) Applicant: SAMSUNG ELECTRONICS CO., LTD., Suwon-si (KR)

(72) Inventors: Hyunwook Kang, Daejeon (KR); Sungchan Kang, Hwaseong-si (KR); Cheheung Kim, Yongin-si (KR); Choongho Rhee, Anyang-si (KR); Hyeokki Hong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 98 days.

(21) Appl. No.: 17/182,911

(22) Filed: Feb. 23, 2021

(65) Prior Publication Data
US 2022/0086570 A1  Mar. 17, 2022

(30) Foreign Application Priority Data
Sep. 17, 2020  (KR) .................. 10-2020-0120030

(51) Int. Cl.
 *H04R 17/10* (2006.01)
 *H04R 17/02* (2006.01)
 (Continued)

(52) U.S. Cl.
 CPC ............ *H04R 17/10* (2013.01); *H04R 17/02* (2013.01); *H10N 30/306* (2023.02); *H10N 39/00* (2023.02); *G01H 1/00* (2013.01); *H03H 9/02244* (2013.01); *H03H 9/02259* (2013.01); *H03H 9/17* (2013.01); *H03H 9/2405* (2013.01)

(58) Field of Classification Search
 CPC ......... H04R 17/10; H04R 17/02; H01L 27/20; H01L 41/1136; H01L 41/187; H01L 41/083; H01L 41/1132; H03H 9/2405; H03H 9/02259; H03H 9/21;
 (Continued)

(56) References Cited

U.S. PATENT DOCUMENTS 8,224,016 B2   7/2012  Song
8,531,088 B2   9/2013  Grosh et al.
(Continued)

FOREIGN PATENT DOCUMENTS

EP   0 959 333 A2   11/1999
JP   4539920 B2    9/2010
(Continued)

OTHER PUBLICATIONS

Communication dated Sep. 3, 2021 issued by the European Patent Office in European Application No. 21164252.5.

*Primary Examiner* — Carolyn R Edwards
*Assistant Examiner* — Kuassi A Ganmavo
(74) *Attorney, Agent, or Firm* — Sughrue Mion, PLLC

(57) ABSTRACT

Provided is a sensor interface including a first cantilever beam bundle including at least one resonator and a first output terminal, a second cantilever beam bundle including at least one resonator and a second output terminal, and a differential amplifier including a first input terminal electrically connected to the first output terminal of the first cantilever beam bundle and a second input terminal electrically connected to the second output terminal of the second cantilever beam bundle.

18 Claims, 17 Drawing Sheets

(51) Int. Cl.
*H10N 30/30* (2023.01)
*H10N 39/00* (2023.01)
*H03H 9/24* (2006.01)
*H03H 9/02* (2006.01)
*G01H 1/00* (2006.01)
*H03H 9/17* (2006.01)

(58) Field of Classification Search
CPC ........ H03H 9/02244; H03H 9/17; G01H 3/08; G01H 1/00; H10N 39/00; H10N 30/306
See application file for complete search history.

(56) References Cited

U.S. PATENT DOCUMENTS

| | | | |
|---|---|---|---|
| 9,479,884 B2 | 10/2016 | Kim | |
| 10,165,342 B2 | 12/2018 | Rocca | |
| 10,225,662 B2 | 3/2019 | Kim | |
| 10,447,238 B2 | 10/2019 | Kang et al. | |
| 2005/0001274 A1* | 1/2005 | Kim | H03H 9/02133 257/416 |
| 2008/0202839 A1* | 8/2008 | Satou | B60R 21/36 180/274 |
| 2009/0079298 A1* | 3/2009 | Park | H04R 21/00 310/311 |
| 2009/0140612 A1* | 6/2009 | Ikeuchi | H04R 1/245 310/348 |
| 2010/0117485 A1* | 5/2010 | Martin | H04R 17/02 310/319 |
| 2016/0050506 A1 | 2/2016 | Kim | |
| 2017/0055056 A1* | 2/2017 | Rocca | H04R 19/005 |
| 2018/0077497 A1* | 3/2018 | Hatipoglu | H03H 9/02244 |
| 2018/0097506 A1* | 4/2018 | Kang | H04R 17/10 |
| 2019/0028799 A1* | 1/2019 | Park | H04R 1/245 |
| 2019/0072635 A1* | 3/2019 | Kang | H04R 17/02 |
| 2019/0122690 A1 | 4/2019 | Kim et al. | |
| 2019/0200119 A1* | 6/2019 | Kang | H04R 17/02 |
| 2020/0127642 A1 | 4/2020 | Ilyas et al. | |

FOREIGN PATENT DOCUMENTS

| | | |
|---|---|---|
| JP | 2013190362 A | 9/2013 |
| JP | 6361896 B2 | 7/2018 |

* cited by examiner

SENSOR INTERFACE INCLUDING RESONATOR AND DIFFERENTIAL AMPLIFIER

CROSS-REFERENCE TO RELATED APPLICATION

This application claims priority to Korean Patent Application No. 10-2020-0120030, filed on Sep. 17, 2020 in the Korean Intellectual Property Office, the disclosure of which is incorporated by reference herein in its entirety.

BACKGROUND

1. Field

Example embodiments of the present disclosure relate to sensor interfaces including resonators and differential amplifiers.

2. Description of Related Art

Sound sensors may be classified into omni-directional sound sensors and directional sound sensors.

An omni-directional sound sensor may include a filter including a membrane. The filter including the membrane generates an electrical signal by causing the membrane to change its capacitance according to a change in a negative pressure applied thereto.

A directional sound sensor is capable of detecting the direction of a sound signal, and may include a filter including resonators having different resonance frequencies. In the filter including a plurality of resonators, an electric signal is generated by a resonator that resonates in response to a sound signal of a specific frequency. A high signal-to-noise ratio (SNR) may be considered as a design goal in relation to the filter including the plurality of resonators.

SUMMARY

One or more example embodiments provide sensor interfaces including resonators and differential amplifiers.

Additional aspects will be set forth in part in the description which follows and, in part, will be apparent from the description, or may be learned by practice of example embodiments.

According to an aspect of an example embodiment, there is provided a sensor interface including a first cantilever beam bundle including at least one resonator and a first output terminal, a second cantilever beam bundle including at least one resonator and a second output terminal, and a differential amplifier including a first input terminal electrically connected to the first output terminal of the first cantilever beam bundle and a second input terminal electrically connected to the second output terminal of the second cantilever beam bundle.

A resonance frequency of the at least one resonator of the first cantilever beam bundle may be different from a resonance frequency of the at least one resonator of the second cantilever beam bundle.

A frequency band of a signal filtered by the first cantilever beam bundle may be different from a frequency band of a signal filtered by the second cantilever beam bundle.

Each of the at least one resonator of the first cantilever beam bundle and each of the at least one resonator of the second cantilever beam bundle may include a sensor device configured to generate an electrical signal based on the respective resonator vibrating.

The sensor device may include an upper electrode, a piezoelectric material layer, and a lower electrode.

The upper electrode of the at least one resonator of the first cantilever beam bundle may be electrically connected to the first input terminal of the differential amplifier, and the upper electrode of the at least one resonator of the second cantilever beam bundle may be electrically connected to the second input terminal of the differential amplifier.

The upper electrode of the at least one resonator of the first cantilever beam bundle may be electrically connected to the first input terminal of the differential amplifier, and the lower electrode of the at least one resonator of the second cantilever beam bundle may be electrically connected to the second input terminal of the differential amplifier.

The upper electrode, the piezoelectric material layer, and the lower electrode may have a same length.

A length of one of the upper electrode, the piezoelectric material layer, and the lower electrode may be different from lengths of remaining ones of the upper electrode, the piezoelectric material layer, and the lower electrode.

Each of the at least one resonator of the first cantilever beam bundle and each of the at least one resonator of the second cantilever beam bundle may include a support member configured to vibrate based on sound, and the lower electrode may be disposed on the support member.

A length of the support member of the at least one resonator of the first cantilever beam bundle and a length of the support member of the at least one resonator of the second cantilever beam bundle may be same.

The support member may be a cantilever.

Each of the at least one resonator of the first cantilever beam bundle and each of the at least one resonator of the second cantilever beam bundle may include a fixing member configured to fix one end of the support member.

A length of the fixing member of the at least one resonator of the first cantilever beam bundle and a length of the fixing member of the at least one resonator of the second cantilever beam bundle may be different from each other.

The differential amplifier may include a first output terminal and a second output terminal.

The differential amplifier may include at least one circuit element electrically connected to the first input terminal and the first output terminal, and the first input terminal may be a positive input terminal and the first output terminal may be a negative output terminal, or the first input terminal may be a negative input terminal and the first output terminal may be a positive output terminal.

The at least one circuit element may be one of a resistor, a capacitor, and a diode.

The sensor interface may further include at least one circuit element electrically connected to the first output terminal of the first cantilever beam bundle and the first input terminal of the differential amplifier.

The first cantilever beam bundle may include a plurality of resonators, wherein each of the plurality of resonators include a support member, and wherein the support members of the plurality of resonators have same length and are configured to vibrate based on sound.

According to another aspect of an example embodiment, there is provided a sound processing device including a sensor interface, the sensor interface including a first cantilever beam bundle including at least one resonator and a first output terminal, a second cantilever beam bundle including at least one resonator and a second output terminal, and a differential amplifier including a first input terminal electrically connected to the first output terminal of the first cantilever beam bundle and a second input terminal electrically connected to the second output terminal of the second cantilever beam bundle, and a processor configured to process an output signal of the sensor interface.

According to yet another aspect of an example embodiment, there is provided a sensor interface including a first cantilever beam bundle including a plurality of resonators and a first output terminal, a second cantilever beam bundle including a plurality of resonators and a second output terminal, and a differential amplifier including a first input terminal electrically connected to the first output terminal of the first cantilever beam bundle and a second input terminal electrically connected to the second output terminal of the second cantilever beam bundle.

A first frequency band of a signal filtered by the first cantilever beam bundle may be different from a second frequency band of a signal filtered by the second cantilever beam bundle.

BRIEF DESCRIPTION OF THE DRAWINGS

The above and/or other aspects, features, and advantages of certain example embodiments will be more apparent from the following description taken in conjunction with the accompanying drawings, in which.

DETAILED DESCRIPTION

Figure 1:
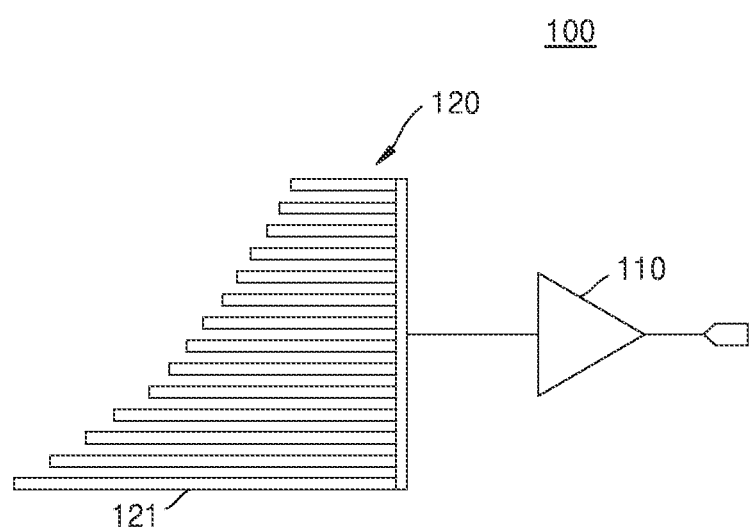
FIG. 1 is a diagram illustrating a sensor interface according to an example embodiment.

Reference will now be made in detail to example embodiments of which are illustrated in the accompanying drawings, wherein like reference numerals refer to like elements throughout. In this regard, the example embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

The terms used in the present disclosure are selected based on general terms currently widely used in the art in consideration of functions regarding the present disclosure, but the terms may vary according to the intention of those of ordinary skill in the art, precedents, or new technology in the art. Also, some terms may be arbitrarily selected by the applicant, and in this case, the meaning of the selected terms will be described in the detailed description of the present disclosure. Thus, the terms used herein should not be construed based on only the names of the terms but should be construed based on the meaning of the terms together with the description throughout the present disclosure.

Terms such as "including" or "comprising" used in the embodiments should not be construed as necessarily including all of various components, or various operations described in the specification, and it should be construed that some of the components or some of the operations may not be included or may further include additional components or operations.

Hereinafter, the present disclosure will now be described more fully with reference to the accompanying drawings. The disclosure may, however, be embodied in many different forms and should not be construed as being limited to the embodiments set forth herein.

FIG. 1 is a diagram illustrating a sensor interface 100 according to an example embodiment.

The sensor interface 100 includes a differential amplifier 110 and a cantilever beam bundle 120.

The cantilever beam bundle 120 may be configured to filter signals in an audible frequency band. For example, the cantilever beam bundle 120 may be configured to filter a sound signal in an audible frequency band in the range of about 20 Hz to about 20 kHz.

The cantilever beam bundle 120 may include a plurality of resonators 121. Resonance frequencies of the plurality of resonators 121 may be different. A sound signal corresponding to a resonance frequency of a resonator may be filtered by the resonator.

The cantilever beam bundle 120 generates an electric signal by the resonator that vibrates in response to the sound signal. The differential amplifier 110 amplifies the electric signal to generate an output signal.

Figure 2:
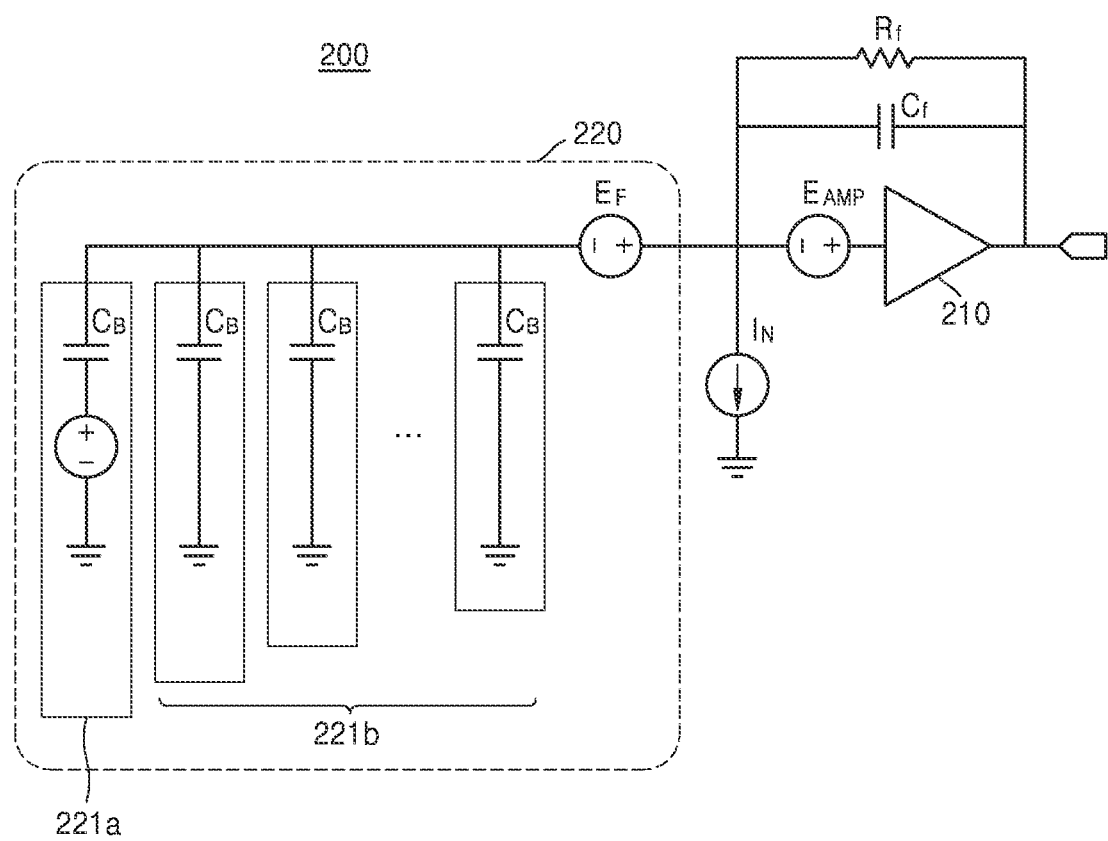
FIG. 2 is a circuit diagram illustrating the sensor interface of FIG. 1 according to an example embodiment.

FIG. 2 is a circuit diagram illustrating the sensor interface 200 of FIG. 1 according to an example embodiment.

The sensor interface 200 may be interpreted as a circuit diagram of FIG. 2, and noise of an output signal of the sensor interface 200 may be expressed as Equation 1 below. In this regard, the noise of the output signal of the sensor interface 200 may be noise of an output signal of the differential amplifier 210.

$$V_{noise}^2 = V_{F\ noise}^2 + V_{current\ noise}^2 + V_{circuit\ noise}^2 \qquad \text{[Equation 1]}$$

$$V_{F\ noise} \propto E_F * \frac{N*C_B}{C_f} \propto \frac{N*C_B}{C_f\sqrt{N*C_B}}$$

-continued $$V_{current\ noise} \propto I_N * R_f$$

$$V_{circuit\ noise} \propto E_{AMP} * \frac{N * C_B}{C_f}$$

The signal-to-noise ratio (SNR) of the sensor interface 200 may be expressed as Equation 2.

$$SNR \propto \frac{C_B/C_f}{E_{AMP} * N * (C_B/C_f)} \quad \text{[Equation 2]}$$

In Equations 1 and 2, $V_{noise}$ denotes the noise of the output signal of the sensor interface 200, $V_{F\ noise}$ denotes noise due to the cantilever beam bundle 220, $V_{current\ noise}$ denotes noise due to the leakage current of the differential amplifier 210, $V_{circuit\ noise}$ denotes noise due to the differential amplifier 210, N denotes the number of resonators of the cantilever beam bundle 220, $C_B$ denotes the capacitance of a resonator, $E_F$ denotes a potential difference between an output terminal of the cantilever beam bundle 220 and ground, $E_{AMP}$ denotes a potential difference between an input terminal of the differential amplifier 210 and ground, $I_N$ denotes a leakage current of the input terminal of the differential amplifier 210, $C_f$ denotes a feedback capacitance of the differential amplifier 210, and $R_f$ denotes a feedback resistance of the differential amplifier 210.

Resonators in the cantilever beam bundle 220 are configured to have different resonance frequencies. Accordingly, when a sound signal of a specific frequency is generated, an electric signal is generated by active resonators 221a having a resonance frequency corresponding to the specific frequency. Referring to Equation 1, $V_{F\ noise}$ and $V_{circuit\ noise}$ are proportional to the number N of the resonators. Further, referring to Equation 2, SNR is inversely proportional to the number N of the resonators. Therefore, when the sound signal of the specific frequency is generated, noise may be generated in the sensor interface 200 due to inactive resonators 221b that do not have a resonance frequency corresponding to the specific frequency.

Figure 3:
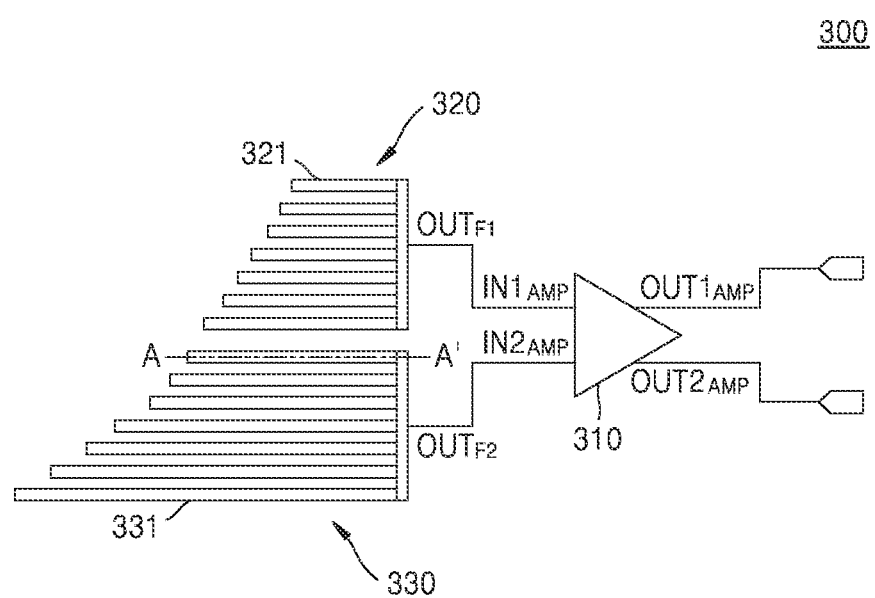
FIG. 3 is a diagram illustrating a sensor interface according to an example embodiment.

FIG. 3 is a diagram illustrating a sensor interface 300 according to an example embodiment.

The sensor interface 300 according to an example embodiment includes a first cantilever beam bundle 320, a second cantilever beam bundle 330, and a differential amplifier 310.

The first cantilever beam bundle 320 and the second cantilever beam bundle 330 may be configured to filter signals in an audible frequency band. A frequency band of the signal filtered by the first cantilever beam bundle 320 may be different from a frequency band of the signal filtered by the second cantilever beam bundle 330. For example, when the sensor interface 300 targets a sound signal in an audible frequency band in the range of about 20 Hz to about 20 kHz, the first cantilever beam bundle 320 may be configured to filter the signal in the frequency band in the range of 20 Hz or more and less than 200 Hz, and the second cantilever beam bundle 330 may be configured to filter the signal in the frequency band in the range of 200 Hz or more and 20 kHz or less.

The first cantilever beam bundle 320 may be configured to include at least one resonator 321. In addition, the second cantilever beam bundle 330 may be configured to include at least one resonator 331. According to design conditions, each of the first cantilever beam bundle 320 and the second cantilever beam bundle 330 may be configured to include tens to thousands of resonators.

In an example embodiment, the first cantilever beam bundle 320 and the second cantilever beam bundle 330 are configured to include the same number of resonators. In another example embodiment, the first cantilever beam bundle 320 and the second cantilever beam bundle 330 may be configured to include different numbers of resonators.

The resonance frequency of the resonator 321 of the first cantilever beam bundle 320 may be different from the resonance frequency of the resonator 331 of the second cantilever beam bundle 330. In addition, when the first cantilever beam bundle 320 includes a plurality of resonators, resonance frequencies of the plurality of resonators may be different from each other. In addition, when the second cantilever beam bundle 330 includes a plurality of resonators, resonance frequencies of the plurality of resonators may be different from each other. However, an embodiment in which a plurality of resonators having the same resonance frequency are used is not excluded.

The differential amplifier 310 may be configured to generate an output signal by amplifying a difference between the signal filtered by the first cantilever beam bundle 320 and the signal filtered by the second cantilever beam bundle 330.

In an example embodiment, a first input terminal $IN1_{AMP}$ of the differential amplifier 310 is electrically connected to an output terminal $OUT_{F1}$ of the first cantilever beam bundle 320, and a second input terminal $IN2_{AMP}$ of the differential amplifier 310 is electrically connected to an output terminal $OUT_{F2}$ of the second cantilever beam bundle 330.

The first input terminal $IN1_{AMP}$ and the output terminal $OUT_{F1}$ may be directly connected or indirectly connected through at least one circuit element. For example, circuit elements such as a resistor, a transistor, a capacitor, or a switch may be disposed between the first input terminal $IN1_{AMP}$ and the output terminal $OUT_{F1}$. Similarly, the second input terminal $IN2_{AMP}$ and the output terminal $OUT_{F2}$ may also be directly connected or indirectly connected through a circuit element.

In an example embodiment, the differential amplifier 310 includes a first output terminal $OUT1_{AMP}$ and a second output terminal $OUT2_{AMP}$. In another example embodiment, the differential amplifier 310 may be configured to include one output terminal.

Figure 4:
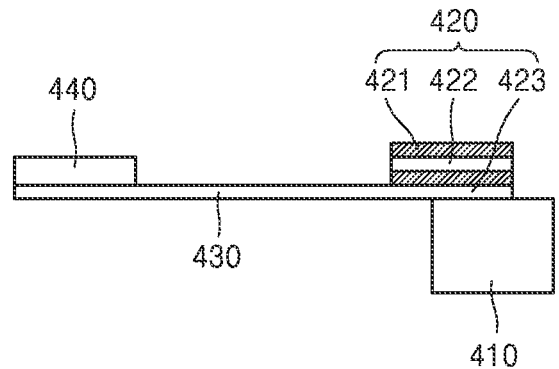
FIG. 4 is a diagram illustrating a resonator according to an example embodiment.

FIG. 4 is a diagram illustrating a resonator according to an example embodiment.

FIG. 4 is a cross-sectional view of the resonator taken along a cutting line A-A' of FIG. 3.

In an example embodiment, the resonator includes a fixing member 410, a sensor unit 420, a support member 430, and a mass body 440.

The fixing member 410 is configured to fix one end of the support member 430. The support member 430 may be a beam. In an example embodiment, the support member 430 is a cantilever, and the mass body 440 is disposed at the other end of the support member 430. The support member 430 may include silicon (Si) or the like, but is not limited thereto. The mass body 440 may include a metal such as gold (Au), but is not limited thereto.

In an example embodiment, the sensor unit 420 which is a sensor device is disposed at one end of the support member 430. The sensor unit 420 may generate an electric signal as the resonator vibrates. The sensor unit 420 may be a piezo sensor. The sensor unit 420 may include an upper electrode 421, a lower electrode 423, and a piezoelectric material layer 422 disposed between the upper electrode 421 and the lower electrode 423.

The lower electrode 423 may be disposed on the support member 430. The lower electrode 423 may be disposed directly on the support member 430. Alternatively, the lower electrode 423 may be disposed above the support member 430. For example, an insulating layer may be selectively disposed between the lower electrode 423 and the support member 430.

The upper electrode 421 and the lower electrode 423 may include a metal material such as molybdenum (Mo). The piezoelectric material layer 422 may include aluminum nitride (AlN), zinc oxide (ZnO), tin (II) oxide (SnO), lead titanium zirconium oxide (PZT), tin zinc oxide (ZnSnO3), polyvinylidene fluoride (PVDF), poly(vinylidene fluoride-trifluoroethylene) (P(VDF-TrFE)), or PMN-PT, but is not limited thereto.

The upper electrode 421, the piezoelectric material layer 422, and the lower electrode 423 may be configured to have the same length, width, and area. Alternatively, length, width, or thickness of any one of the upper electrode 421, the piezoelectric material layer 422, and the lower electrode 423 may be configured to be different from the corresponding lengths, widths, or thicknesses of the other ones.

Each of resonators may be configured to have a separate upper electrode 421, a piezoelectric material layer 422, and a lower electrode 423. Alternatively, each of the resonators may be configured to include the upper electrode 421 and the piezoelectric material layer 422, and all of the resonators may be configured to include the lower electrode 423 as a common electrode. Alternatively, each of the resonators may be configured to include the lower electrode 423 and the piezoelectric material layer 422, and all of the resonators may be configured to include the upper electrode 421 as a common electrode.

Figure 5:
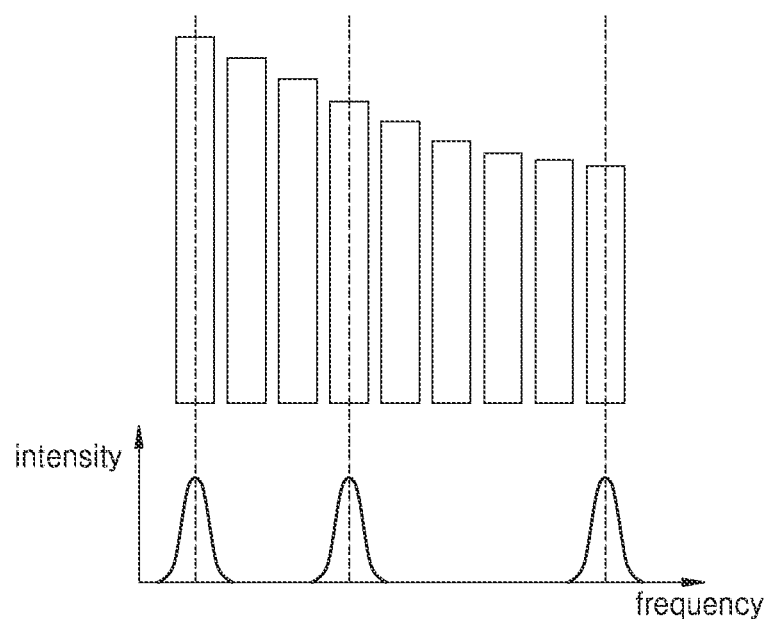
FIG. 5 is a diagram illustrating a relationship between lengths of resonators and resonance frequencies according to an example embodiment.

In a sensor interface according to an example embodiment, when vibration, sound, or force acts from the outside of the resonator, an inertial force may be generated according to the movement of the mass body 440. When the resonance frequency of the support member 430 coincides with the frequency of external vibration, sound, or force, a resonance phenomenon occurs and inertia force increases. The increased inertia force generates a bending moment in the sensor unit 420, and the bending moment induces stress in each layer of the sensor unit 420. The piezoelectric material layer 422 may generate charge having the magnitude proportional to the stress applied to the piezoelectric material layer 422, and generates voltage inversely proportional to the capacitance between the upper electrode 421 and the lower electrode 423. As a result, the voltage generated in the sensor unit 420 may be detected and analyzed by an external force such as vibration, sound, or force from the outside, and thus information about the external force may be obtained FIG. 5 is a diagram illustrating a relationship between lengths of resonators and resonance frequencies according to an example embodiment.

A sensor interface according to an example embodiment may include resonators having different resonance frequencies.

Because support members of the resonators have different lengths, the resonance frequencies of the resonators may be different from each other. In this case, the shorter the length of the support member, the higher the resonance frequency of the resonator may be.

Alternatively, because the support members of the resonators have the same length and the fixing members of the resonators have different lengths, the resonance frequencies of the resonators may be different from each other. As the length of a fixing member increases in a direction parallel to the support member, a fixed part in the support member increases, and thus the length of a non-fixed part in the support member may be reduced. Therefore, in this case, as the length of the fixing member increases, the resonance frequency of the resonator may increase.

As described above, because resonators having the same length of the support members may be implemented to have different resonance frequencies, lengths of support members of first and second cantilever beam bundles according to an example embodiment may be the same, and lengths of fixing members may be different. In addition, the resonators included in one cantilever beam bundle may be configured to include support members of the same length and fixing members of different lengths.

Figure 6:
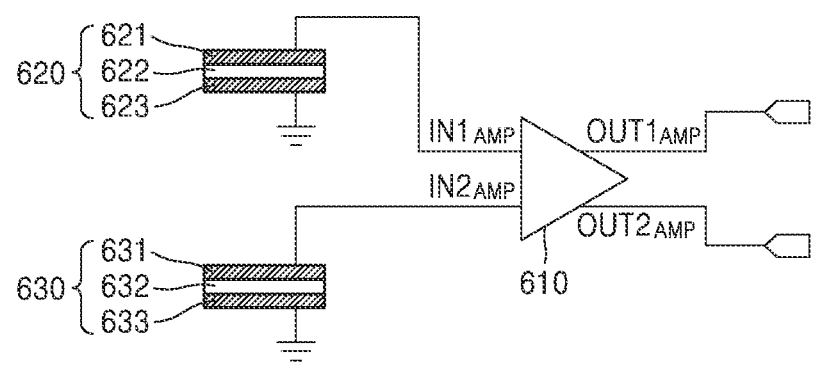
FIG. 6 is a diagram illustrating a connection method with respect to resonators and a differential amplifier according to an example embodiment.

FIG. 6 is a diagram illustrating a connection method of resonators and a differential amplifier 610 according to an example embodiment.

FIG. 6 illustrates a sensor unit 620 of the resonator of a first cantilever beam bundle, a sensor unit 630 of the resonator of a second cantilever beam bundle, and the differential amplifier 610 according to an example embodiment.

In an example embodiment, the sensor unit 620 includes an upper electrode 621, a piezoelectric material layer 622, and a lower electrode 623, and the sensor unit 630 includes an upper electrode 631 and a piezoelectric material layer 632, and a lower electrode 633.

Lengths, widths, or thicknesses of the sensor unit 620 and the sensor unit 630 may be the same or different. Similarly, length, width, or thickness of each of the upper electrode 621, the piezoelectric material layer 622, and the lower electrode 623 may be the same as or different from length, width, or thickness of each of the corresponding upper electrode 631, piezoelectric material layer 632, and lower electrode 633.

In an example embodiment, a first input terminal $IN1_{AMP}$ of the differential amplifier 610 is electrically connected to the upper electrode 621 of the sensor unit 620, and a second input terminal $IN2_{AMP}$ of the differential amplifier 610 is electrically connected to the upper electrode 631 of the sensor unit 630.

The lower electrode 623 of the sensor unit 620 and the lower electrode 633 of the sensor unit 630 may be grounded. Lower electrodes of the sensor units 620 of the resonators of the first cantilever beam bundle may be separately grounded through a plurality of terminals or grounded through one terminal. Similarly, lower electrodes of the sensor units 630 of the resonators of the second cantilever beam bundle may be separately grounded through a plurality of terminals or grounded through one terminal.

When an electric signal input to the first input terminal $IN1_{AMP}$ of the differential amplifier 610 is denoted by $V_1$, and an electric signal input to the second input terminal $IN2_{AMP}$ is denoted by $V_2$, an output signal $V_{out}$ of the differential amplifier 610 may be expressed as Equation 3.

$$V_{out}=G(V_1-V_2) \quad \text{[Equation 3]}$$

In Equation 3, G denotes a gain of the differential amplifier 610.

An n-th resonance frequency of the resonator of the first cantilever beam bundle and an m-th resonance frequency of the resonator of the second cantilever beam bundle may be the same of may be different.

Figure 7:
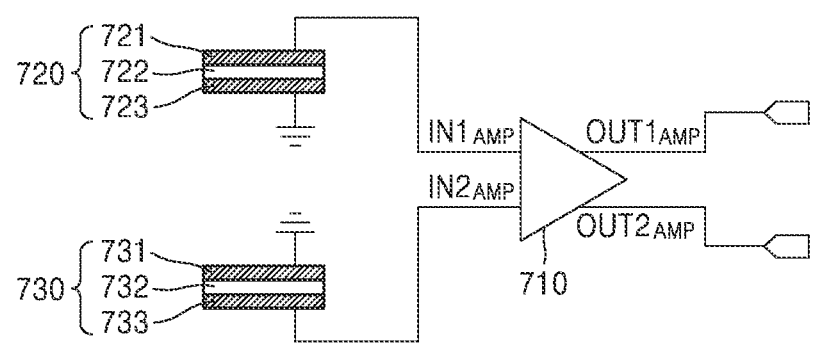
FIG. 7 is a diagram illustrating a connection method with respect to resonators and a differential amplifier according to an example embodiment.

FIG. 7 is a diagram illustrating a connection method of resonators and a differential amplifier 710 according to an example embodiment.

FIG. 7 illustrates a sensor unit 720 of the resonator of a first cantilever beam bundle, a sensor unit 730 of the resonator of a second cantilever beam bundle, and the differential amplifier 710 according to an example embodiment.

In an example embodiment, the sensor unit 720 includes an upper electrode 721, a piezoelectric material layer 722, and a lower electrode 723, and the sensor unit 730 includes an upper electrode 731 and a piezoelectric material layer 732, and a lower electrode 733.

In an example embodiment, the first input terminal $IN1_{AMP}$ of the differential amplifier 710 is electrically connected to the upper electrode 721 of the sensor unit 720, and the second input terminal $IN2_{AMP}$ of the differential amplifier 710 is electrically connected to the lower electrode 733 of the sensor unit 730.

The lower electrode 723 of the sensor unit 720 and the upper electrode 731 of the sensor unit 730 may be grounded. Lower electrodes of the sensor units 720 of the resonators of the first cantilever beam bundle may be separately grounded through a plurality of terminals or grounded through one terminal. Similarly, upper electrodes of the sensor units 730 of the resonators of the second cantilever beam bundle may be separately grounded through a plurality of terminals or grounded through one terminal.

When an electric signal input to the first input terminal $IN1_{AMP}$ of the differential amplifier 710 is denoted by $V_1$, and an electric signal input to the second input terminal $IN2_{AMP}$ is denoted by $V_2$, the output signal $V_{out}$ of the differential amplifier 710 may be expressed as Equation 4.

$$V_{out}=G(V_1-(-V_2))$$ [Equation 4]

In Equation 4, G denotes a gain of the differential amplifier 710.

By electrically connecting the sensor units 720 and 730 and the differential amplifier 710 as in the example embodiment shown in FIG. 7, a subtraction operation of the differential amplifier 710 may be converted into an addition operation thereby preventing the output signal $V_{out}$ from being removed.

When an n-th resonance frequency of the resonator of the first cantilever beam bundle and an m-th resonance frequency of the resonator of the second cantilever beam bundle are the same, the electrical signal $V_1$ input to the first input terminal $IN1_{AMP}$ and the electrical signal $V_2$ input to the second input terminal $IN2_{AMP}$ may be the same. When the sensor interface is implemented as in the example embodiment shown in FIG. 7, the differential amplifier 710 performs the addition operation, thereby preventing the output signal $V_{out}$ from being removed.

Figure 8:
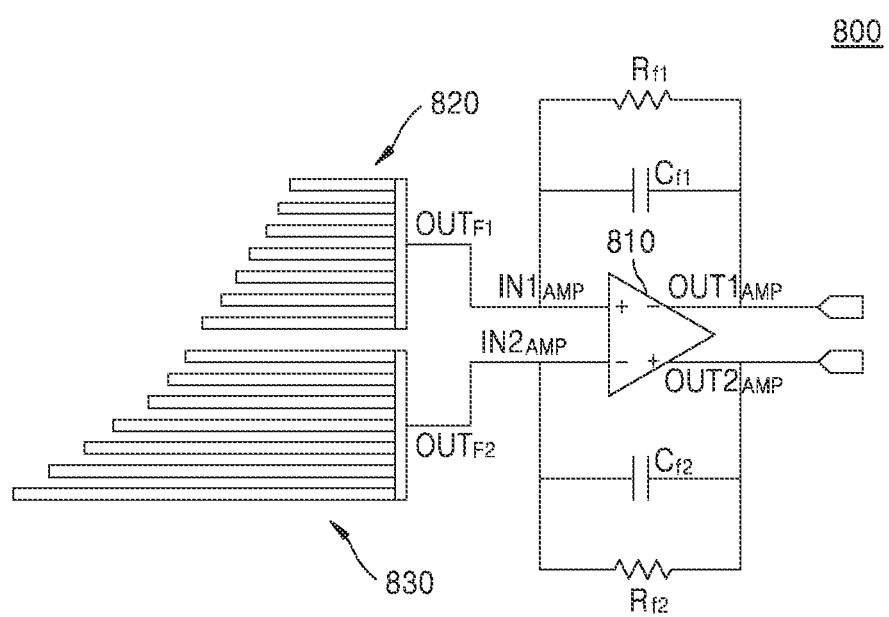
FIG. 8 is a diagram illustrating feedback resistances and feedback capacitances of a differential amplifier according to an example embodiment.

FIG. 8 is a diagram illustrating feedback resistors $R_{f1}$ and $R_{f2}$ and feedback capacitances $C_{f1}$ and $C_{f2}$ of a differential amplifier 810 according to an example embodiment.

A sensor interface 800 according to an example embodiment includes a first cantilever beam bundle 820, a second cantilever beam bundle 830, and the differential amplifier 810.

In an example embodiment, the first input terminal $IN1_{AMP}$ electrically connected to the output terminal $OUT_{F1}$ of the first cantilever beam bundle 820 is a positive input terminal, and the second input terminal $IN2_{AMP}$ electrically connected to the output terminal $OUT_{F2}$ of the second cantilever beam bundle 830 is a negative input terminal. However, embodiments are not limited thereto. According to another example embodiment, the first input terminal $IN1_{AMP}$ may be a negative input terminal and the second input terminal $IN2_{AMP}$ may be a positive input terminal.

The differential amplifier 810 may include at least one circuit element electrically connected to the first input terminal $IN1_{AMP}$ and the first output terminal $OUT1_{AMP}$. The differential amplifier 810 may also include at least one circuit element electrically connected to the second input terminal $IN2_{AMP}$ and the second output terminal $OUT2_{AMP}$. The circuit element may be a resistor, a capacitor, or a diode, but is not limited thereto. For example, the differential amplifier 810 may include only a feedback resistor or only a feedback capacitor as the circuit element. In another example, the differential amplifier 810 may include a feedback diode as the circuit element.

In an example embodiment, the differential amplifier 810 includes the feedback resistor $R_{f1}$ and the feedback capacitance CH electrically connected to the first input terminal $IN1_{AMP}$ and the first output terminal $OUT1_{AMP}$, and the feedback resistor $R_{f2}$ and the feedback capacitance $C_{f2}$ electrically connected to the second input terminal $IN2_{AMP}$ and the second output terminal $OUT2_{AMP}$. Values of the feedback resistors $R_{f1}$ and $R_{f2}$ may be the same or different. Also, values of the feedback capacitances $C_{f1}$ and $C_{f2}$ may be the same or different.

When the first input terminal $IN1_{AMP}$ is a positive input terminal, the first output terminal $OUT1_{AMP}$ may be a negative output terminal, and when the first input terminal $IN1_{AMP}$ is a negative input terminal, the first output terminal $OUT1_{AMP}$ may be a positive input terminal. Similarly, when the second input terminal $IN2_{AMP}$ is a positive input terminal, the second output terminal $OUT2_{AMP}$ may be a negative output terminal, and when the second input terminal $IN2_{AMP}$ is a negative input terminal, the second output terminal $OUT2_{AMP}$ may be a positive output terminal. As described above, the feedback resistors $R_{f1}$ and $R_{f2}$ and the feedback capacitances $C_{f1}$ and $C_{f2}$ are connected in consideration of signs of the input/output terminals of the differential amplifier 810, and thus a desired output signal may be obtained.

Figure 9:
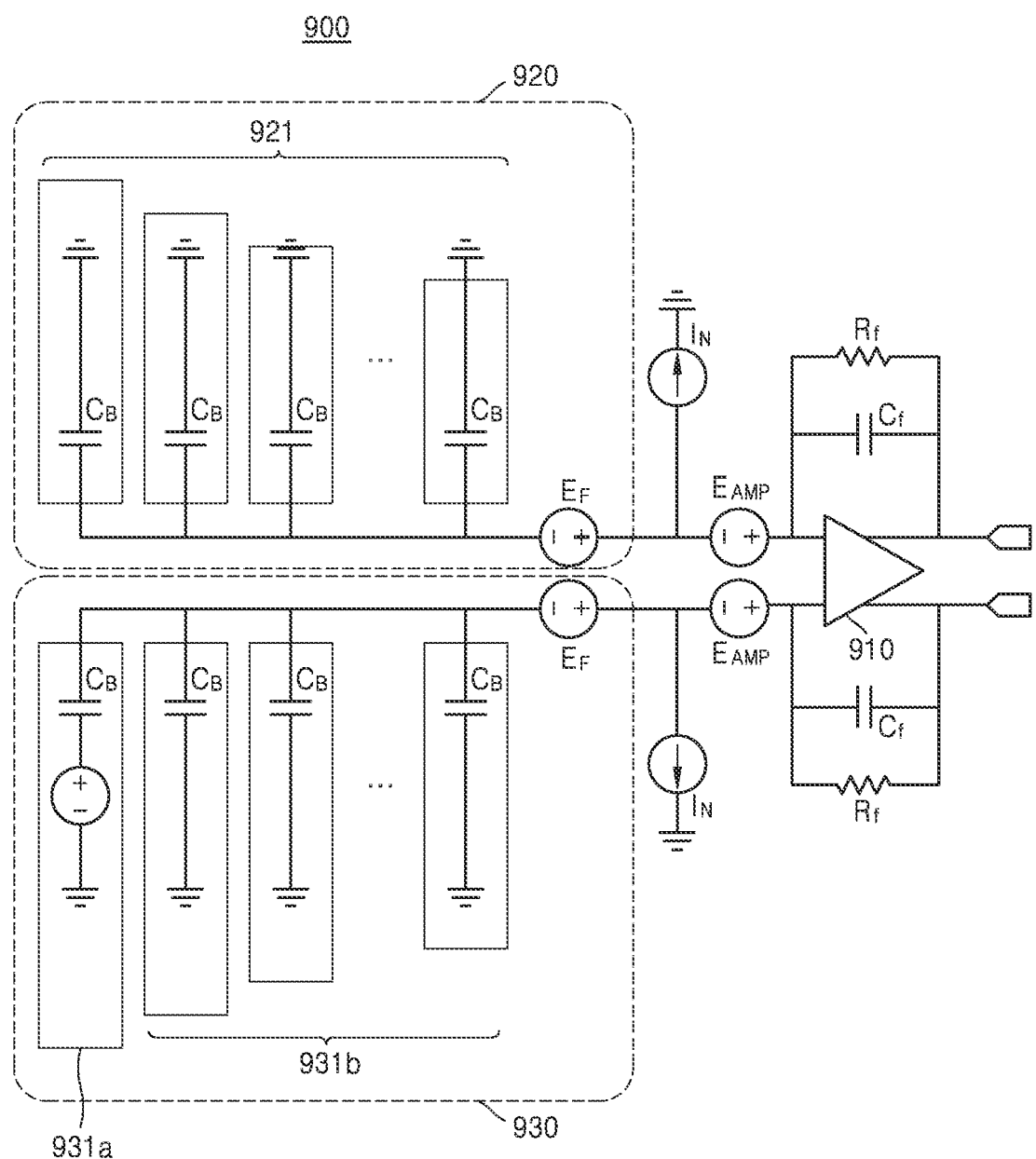
FIG. 9 is a circuit diagram illustrating the sensor interface of FIG. 3 according to an example embodiment.

FIG. 9 is a circuit diagram illustrating a sensor interface 900 of FIG. 3 according to an example embodiment.

In an example embodiment, the sensor interface 900 includes a first cantilever beam bundle 920 and a second cantilever beam bundle 930 having the same number of resonators. The resonators of the first and second cantilever beam bundles 920 and 930 are configured to have different resonance frequencies. Therefore, when a sound signal of a specific frequency is generated, an electric signal is generated by an active resonator 931a having a resonance frequency corresponding to the specific frequency.

The sensor interface 900 may be interpreted as a circuit diagram shown in FIG. 9.

When the resonators of the first and second cantilever beam bundles 920 and 930 have the same capacitance $C_B$, a potential difference between output terminals of the first and second cantilever beam bundles 920 and 930 and the ground is denoted by $E_F$, a potential difference between input terminals of the differential amplifier 910 and the grounds is denoted by $E_{AMP}$, a leakage current of the input terminals of the differential amplifier 910 is denoted by $I_N$, feedback capacitances of the differential amplifier 910 are denoted by $C_f$, and feedback resistances of the differential amplifier 910 are denoted by $R_f$, noise of the output signal of the interface 900 may be expressed as Equation 5.

$$V^2_{total\ noise} = V^2_{noise1} + V^2_{noise2}$$ [Equation 5]

$$V^2_{noise} = V^2_{F\ noise} + V^2_{current\ noise} + V^2_{circuit\ noise}$$

-continued $$V_{F\ noise} \propto E_F * \frac{M * C_B}{C_f} \propto \frac{M * C_B}{C_f \sqrt{M * C_B}}$$

$$V_{current\ noise} \propto I_N * R_f$$

$$V_{circuit\ noise} \propto E_{AMP} * \frac{M * C_B}{C_f}$$

Further, the SNR of the sensor interface 900 may be expressed as Equation 6.

$$SNR \propto \frac{C_B / C_f}{E_{AMP} * M * (C_B / C_f)} \qquad \text{[Equation 6]}$$

In Equations 5 and 6, $V_{total\ noise}$ denotes the total noise of the output signal of the sensor interface 900, $V_{noise1}$ denotes noise due to the first cantilever beam bundle 920 among the noise of the output signal of the sensor interface 900, $V_{noise2}$ denotes noise due to the second cantilever beam bundle 930 among the noise of the output signal of the sensor interface 900, $V_{F\ noise}$ denotes noise due to the cantilever beam bundle 920 (or the cantilever beam bundle 930), $V_{current\ noise}$ denotes noise due to the leakage current IN of the differential amplifier 910, $V_{circuit\ noise}$ denotes noise due to the differential amplifier 910, and M denotes the number of resonators of the first cantilever beam bundle 920 or the second cantilever beam bundle 930.

Compared with the sensor interface 200 of FIG. 2, the sensor interface 900 of FIG. 9 divides cantilever beam bundles into first and second cantilever beam bundles 920 and 930, and thus the number of resonators included in one cantilever beam bundle may be reduced. Specifically, when the number of resonators of the cantilever beam bundle 220 of FIG. 2 is N, the number of resonators of the first cantilever beam bundle 920 or the second cantilever beam bundle 930 may be M=N/2.

Referring to Equation 5, $V_{circuit\ noise}$ is proportional to the number M of resonators. Because M=N/2, compared with the sensor interface 200 of FIG. 2, $V_{circuit\ noise}$ of the sensor interface 900 of FIG. 9 is reduced by 2 times. Accordingly, a noise component due to $V_{circuit\ noise}$ is reduced by $\sqrt{2}$ times in $V_{total\ noise}$.

Further, referring to Equation 6, SNR is inversely proportional to the number M of resonators. Because M=N/2, compared with the sensor interface 200 of FIG. 2, the SNR of the sensor interface 900 of FIG. 9 increases by 2 times.

Accordingly, the sensor interface 900 is configured as the separated two cantilever beam bundles 920 and 930, and thus the noise of the sensor interface 900 may be reduced. In addition, when a sound signal of a specific frequency is generated, an influence of inactive resonators 921 and 931b having no resonance frequency corresponding to the specific frequency on the noise of the sensor interface 900 may be reduced.

In an example embodiment, the differential amplifier 910 may include a transistor. $V_{circuit\ noise}$ that is reduced by 2 times may improve performance of a transistor and bring a design margin such as, for example, a size of the transistor, number of transistors, arrangement of transistors, and the like.

The thermal noise power of the differential amplifier 910 may be expressed as Equation 7.

$$\text{Thermal noise power} = \frac{k * T}{C_{dual}} = V^2_{circuit\ noise} \qquad \text{[Equation 7]}$$

In Equation 7, k denotes Planck's constant, T denotes temperature of the transistor of the differential amplifier 910, and $C_{dual}$ denotes capacitance of the transistor of the differential amplifier 910.

When the capacitance of the transistor of the differential amplifier 210 of FIG. 2 is denoted by $C_{single}$, the relationship between $C_{single}$ and $C_{dual}$ may be expressed as Equation 8.

$$\frac{k * T}{C_{dual}} = \frac{k * T / C_{single}}{2} \qquad \text{[Equation 8]}$$

$$C_{dual} = \frac{C_{single}}{2}$$

Accordingly, the capacitance $C_{dual}$ of the transistor of the differential amplifier 910 of FIG. 9 may be reduced to 50% of the capacitance $C_{single}$ of the transistor of the differential amplifier 210 of FIG. 2.

The dynamic power of the transistor of the differential amplifier 910 may be expressed as Equation 9.

$$\text{Dynamic power} = C_{dual} * V_{DD}^2 \qquad \text{[Equation 9]}$$

In Equation 9, $V_{DD}$ denotes the power of the transistor, and $C_{dual}$ denotes the capacitance of the transistor.

When the dynamic power of the transistor of the differential amplifier 210 of FIG. 2 is denoted by $P_{single}$, and the dynamic power of the transistor of the differential amplifier 910 of FIG. 9 is denoted by $P_{dual}$, from Equations 8 and 9, the relationship between $P_{single}$ and $P_{dual}$ may be expressed as Equation 10.

$$P_{dual} = \frac{P_{single}}{2} \qquad \text{[Equation 10]}$$

Accordingly, the dynamic power $P_{dual}$ of the transistor of the differential amplifier 910 of FIG. 9 may be reduced to 50% of the dynamic power $P_{single}$ of the transistor of the differential amplifier 210 of FIG. 2.

The capacitance of the transistor of the differential amplifier 910 may be expressed as Equation 11.

$$C_{dual} = \varepsilon \frac{A_{dual}}{d} \qquad \text{[Equation 11]}$$

In Equation 11, $\varepsilon$ denotes a dielectric constant of the transistor, $A_{dual}$ denotes an area of the transistor, and d denotes a distance between parallel electrode plates of the transistor.

When the area of the transistor of the differential amplifier 210 of FIG. 2 is denoted by $A_{single}$, from Equations 8 and 11, the relationship between $A_{single}$ and $A_{dual}$ may be expressed as Equation 12.

$$A_{dual} = \frac{A_{single}}{2} \qquad \text{[Equation 12]}$$

Accordingly, the area $A_{dual}$ of the transistor of the differential amplifier 910 of FIG. 9 may be reduced to 50% of the area $A_{single}$ of the transistor of the differential amplifier 210 of FIG. 2.

Accordingly, the reduced $V_{circuit\ noise}$ of the sensor interface 900 may reduce the thermal noise power and dynamic power of the transistor of the differential amplifier 910, thereby improving the performance of the differential amplifier 910. In addition, the reduced $V_{circuit\ noise}$ of the sensor interface 900 may reduce the area of the transistor of the differential amplifier 910, thereby bringing a design margin of the differential amplifier 910.

Figure 10A:
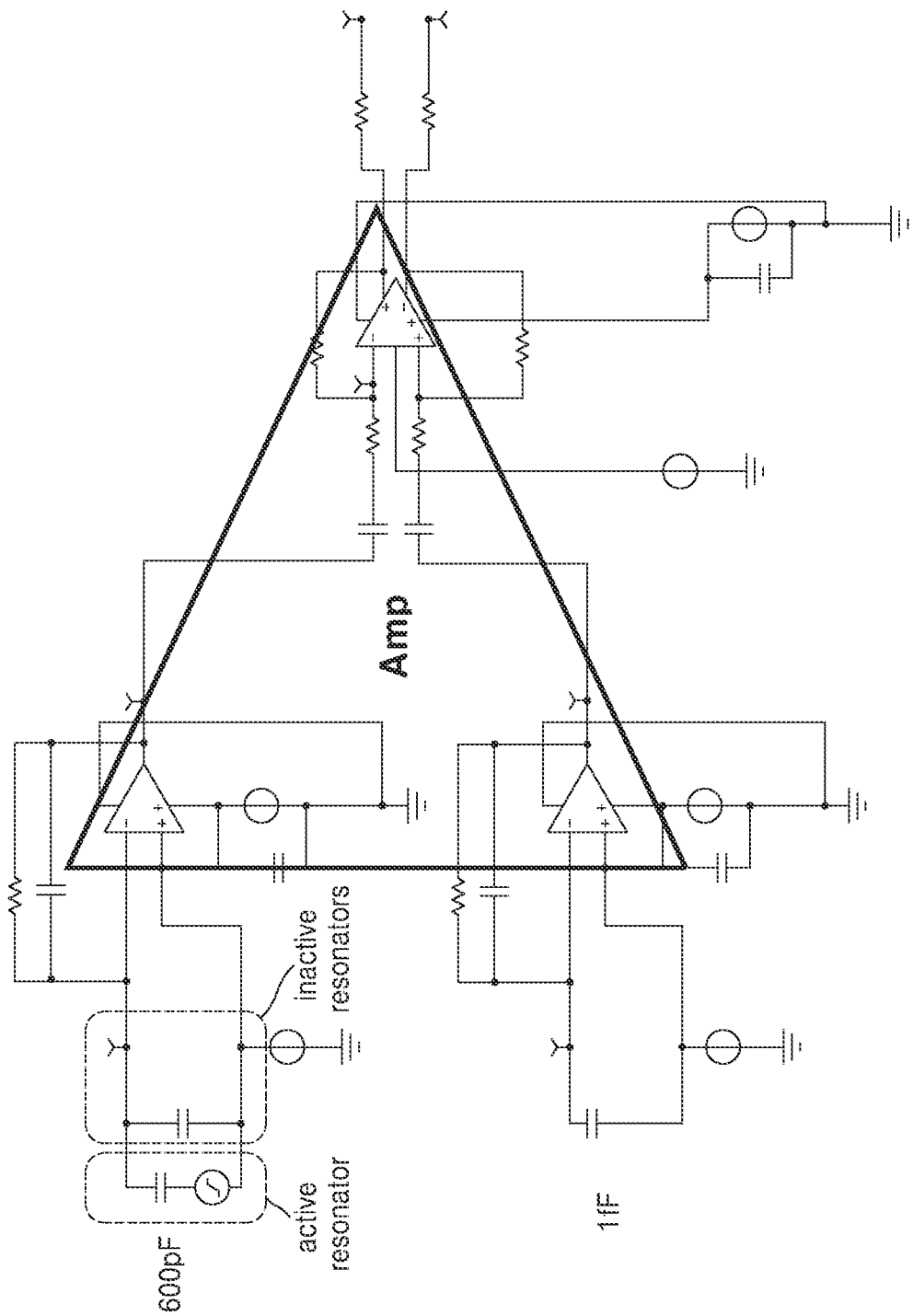
FIGS. 10A, 10B, and 10C are diagrams illustrating noise of the sensor interface of FIG. 1.
Figure 10B:
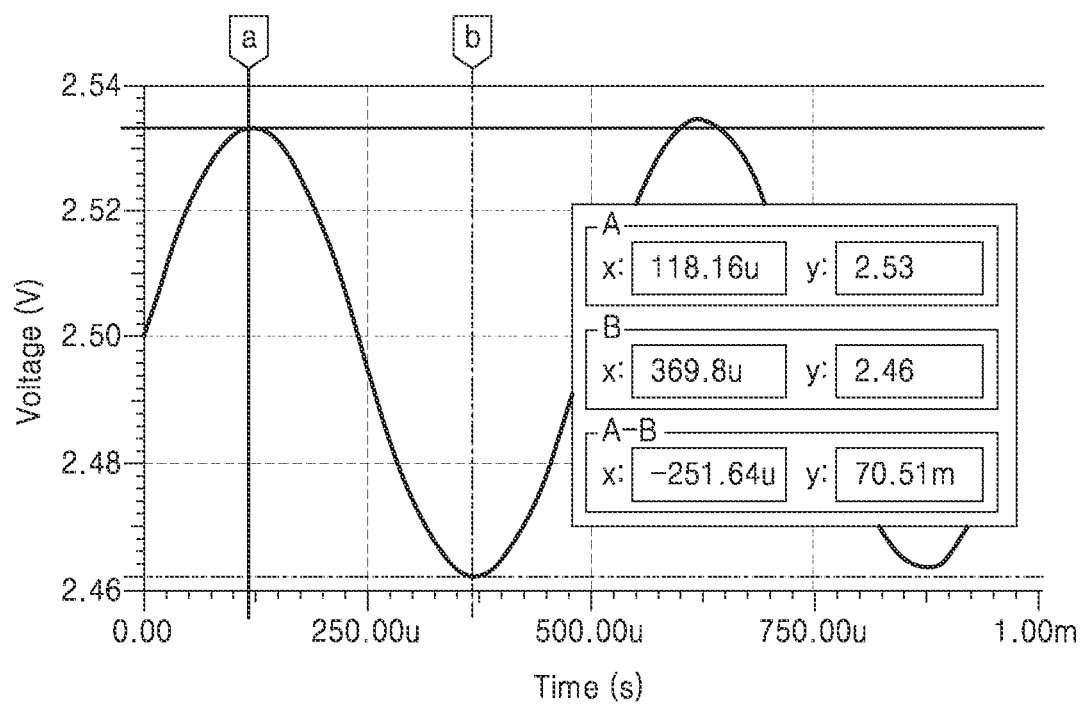
Figure 10C:
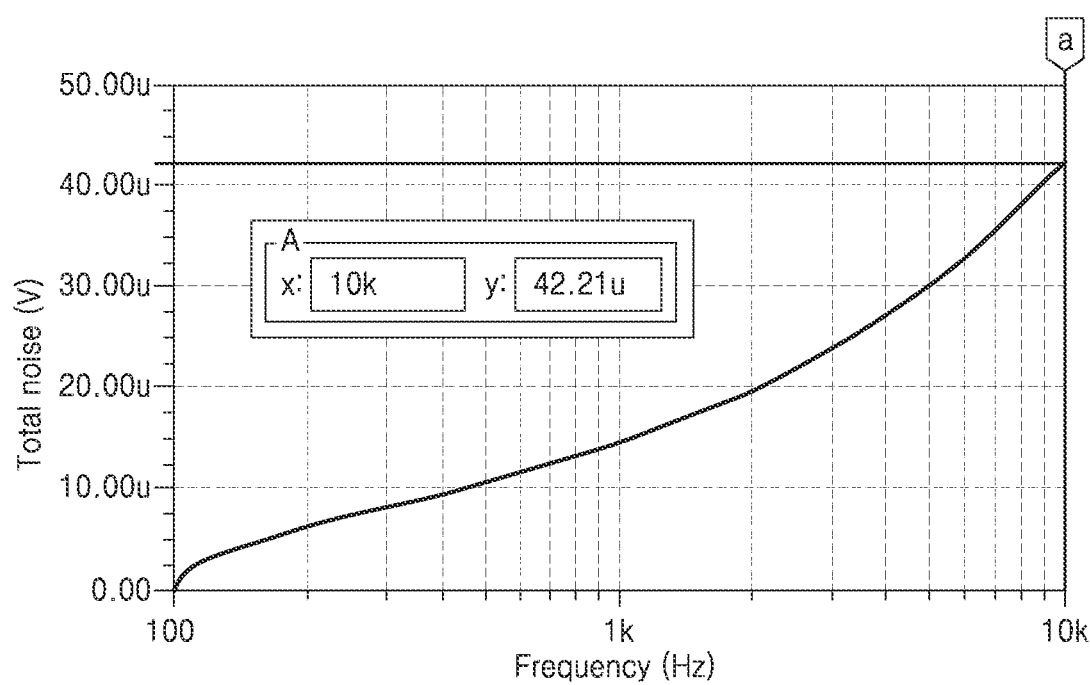

FIGS. 10A to 10C are diagrams illustrating noise of a sensor interface of FIG. 1.

FIG. 10A is a circuit implementing the sensor interface of FIG. 1, FIG. 10B is a graph of an output signal of the sensor interface, and FIG. 10C illustrates a cumulative noise of the output signal of the sensor interface.

Referring to FIGS. 10A to 10C, the output signal of the sensor interface is 2.53 Vat 118.16 μs, and 2.46 Vat 369.8 μs, and the amplitude of the output signal is 70.5 mV. In addition, noise of the output signal accumulated while sensing a signal in the range of about 100 Hz to about 10 kHz is 42.24 μV.

Figure 11A:
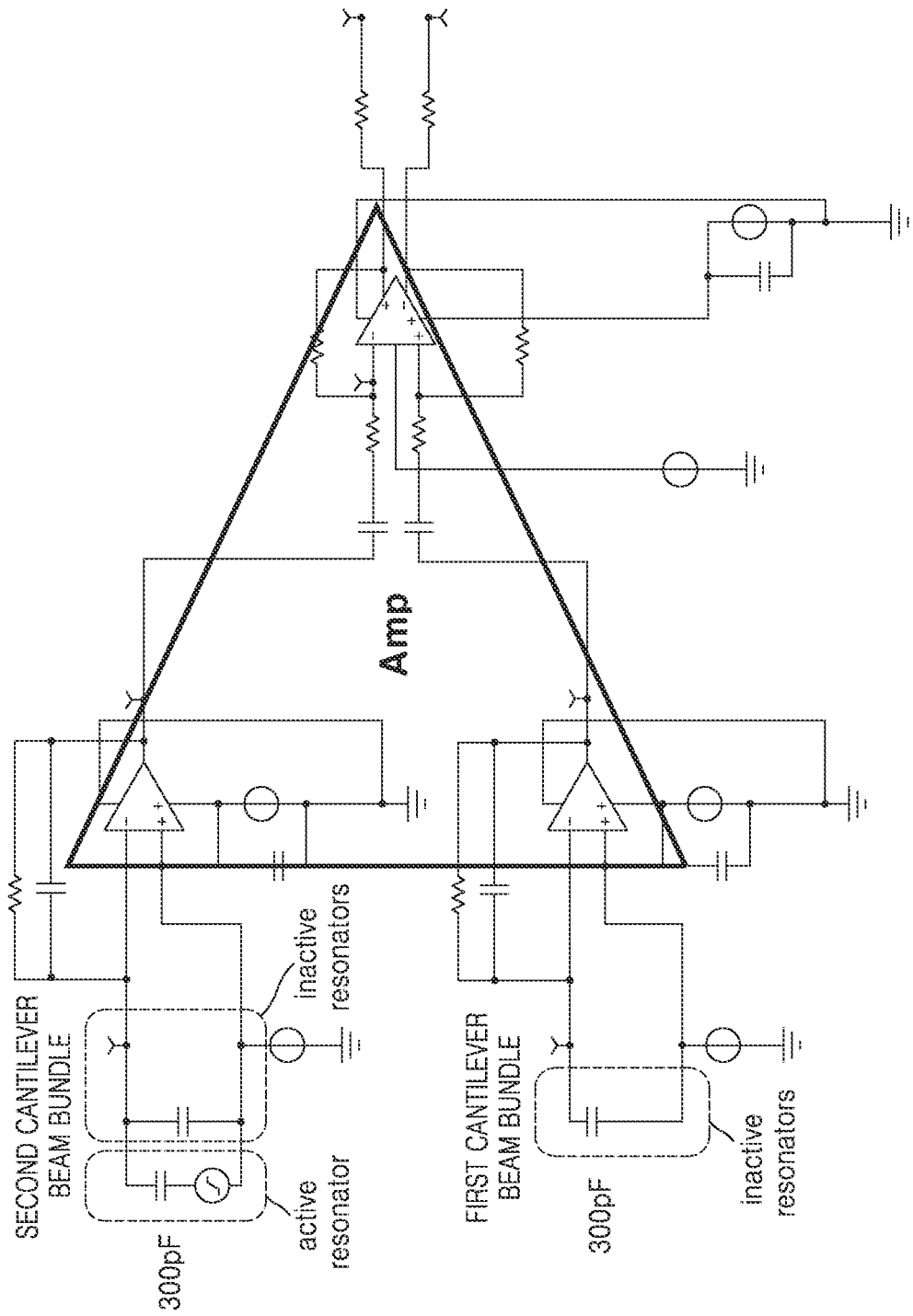
FIGS. 11A, 11B, and 11C are diagrams illustrating noise of the sensor interface of FIG. 3.
Figure 11B:
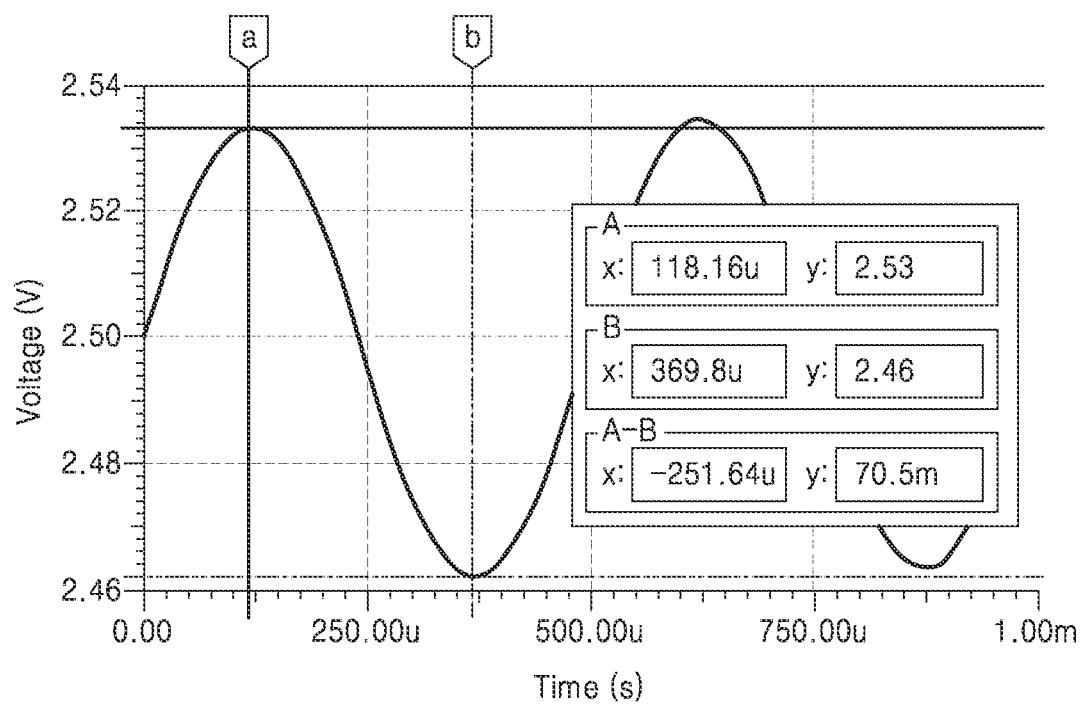
Figure 11C:
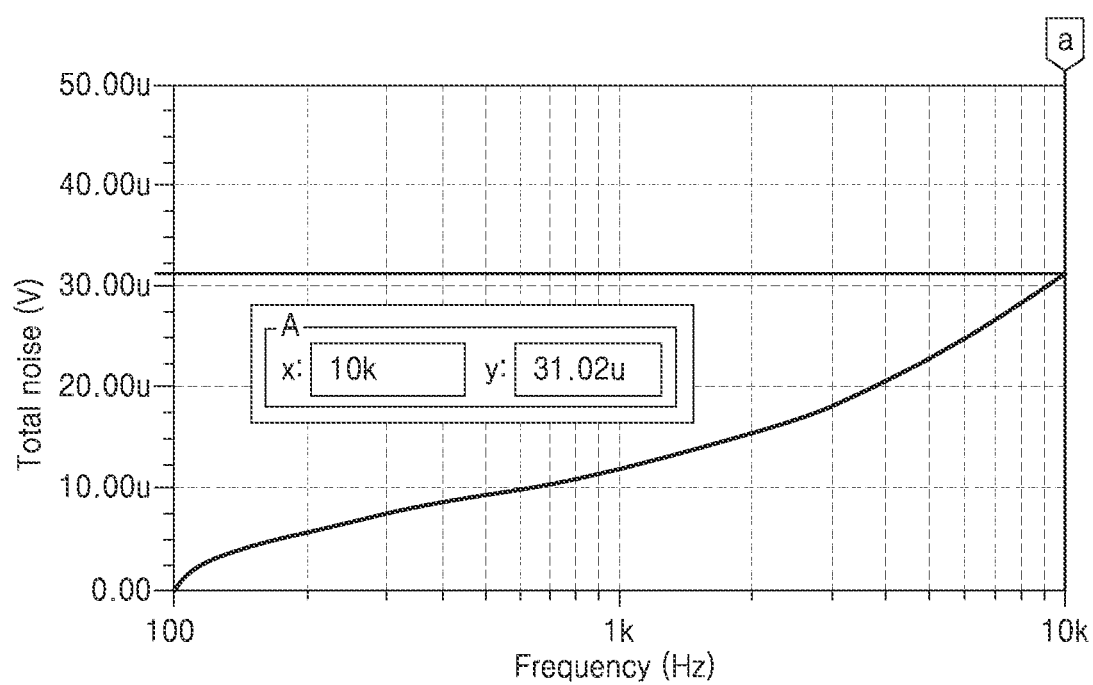

FIGS. 11A to 11C are diagrams illustrating noise of a sensor interface of FIG. 3.

FIG. 11A is a circuit implementing the sensor interface of FIG. 3, FIG. 11B is a graph of an output signal of the sensor interface, and FIG. 11C illustrates a cumulative noise of the output signal of the sensor interface.

Referring to FIGS. 11A to 11C, the output signal of the sensor interface is 2.53 V at 118.16 μs, and 2.46 V at 369.8 μs, and the amplitude of the output signal is 70.5 mV. In addition, the noise of the output signal accumulated while sensing a signal in the range of about 100 Hz to about 10 kHz is 31.02 μV.

When comparing FIGS. 10A to 10C with FIGS. 11A to 11C, the amplitude of the output signal of the sensor interface is the same as 70.5 mV, whereas the noise of the output signal is reduced by about times from 42.24 μV to 31.02 μV. That is, an SNR increases by about 3 dB. Therefore, the sensor interface may be configured by separating cantilever beam bundles such that an output signal with improved noise may be obtained without a change in the amplitude.

Figure 12:
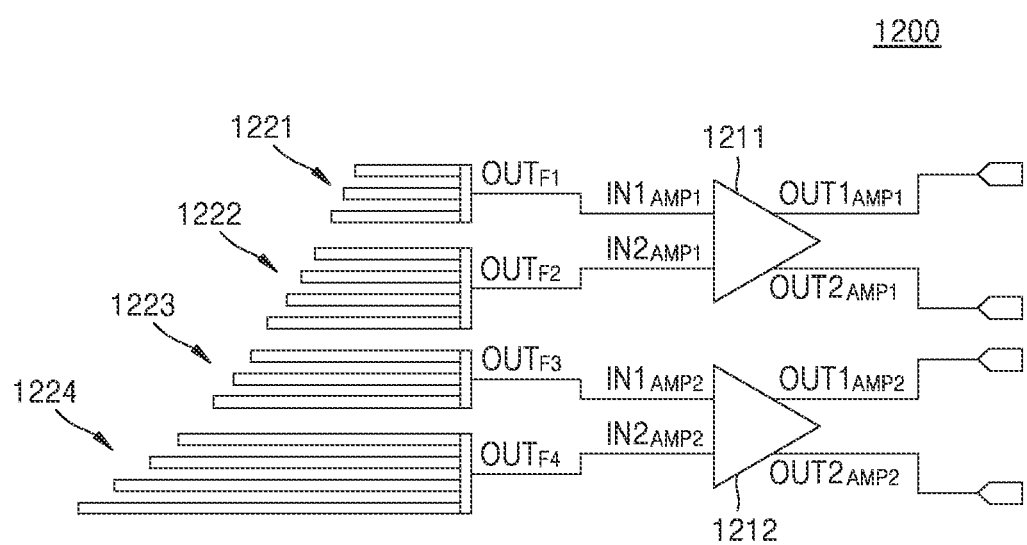
FIG. 12 is a diagram illustrating a sensor interface according to an example embodiment.

FIG. 12 is a diagram illustrating a sensor interface 1200 according to an example embodiment.

A sensor interface of FIG. 3 is configured as two separated cantilever beam bundles, whereas the sensor interface 1200 of FIG. 12 is configured as four separated cantilever beam bundles 1221 to 1224. In an example embodiment, the sensor interface 1200 includes the four cantilever beam bundles 1221 to 1224 and two differential amplifiers 1211 and 1212.

The cantilever beam bundles 1221 to 1224 and the differential amplifiers 1211 and 1212 may include the configurations and functions of the cantilever beam bundle and the differential amplifier described in the above example embodiments, and thus redundant descriptions thereof will be omitted.

The cantilever beam bundles 1221 to 1224 may be configured to filter signals of different frequency bands.

The output terminal $OUT_{F1}$ of the first cantilever beam bundle 1221 and the first input terminal $IN1_{AMP1}$ of the first differential amplifier 1211 may be electrically connected, and the output terminal $OUT_{F2}$ of the second cantilever beam bundle 1222 and the second input terminal $IN2_{AMP1}$ of the first differential amplifier 1211 may be electrically connected. The third and fourth cantilever beam bundles 1223 and 1224 and the second differential amplifier 1212 may be connected in the same manner.

The first and second differential amplifiers 1211 and 1212 may generate output signals by amplifying the filtered signals.

According to example embodiments, the sensor interface may be configured as cantilever beam bundles separated into various numbers such as 8, 16, etc.

Figure 13:
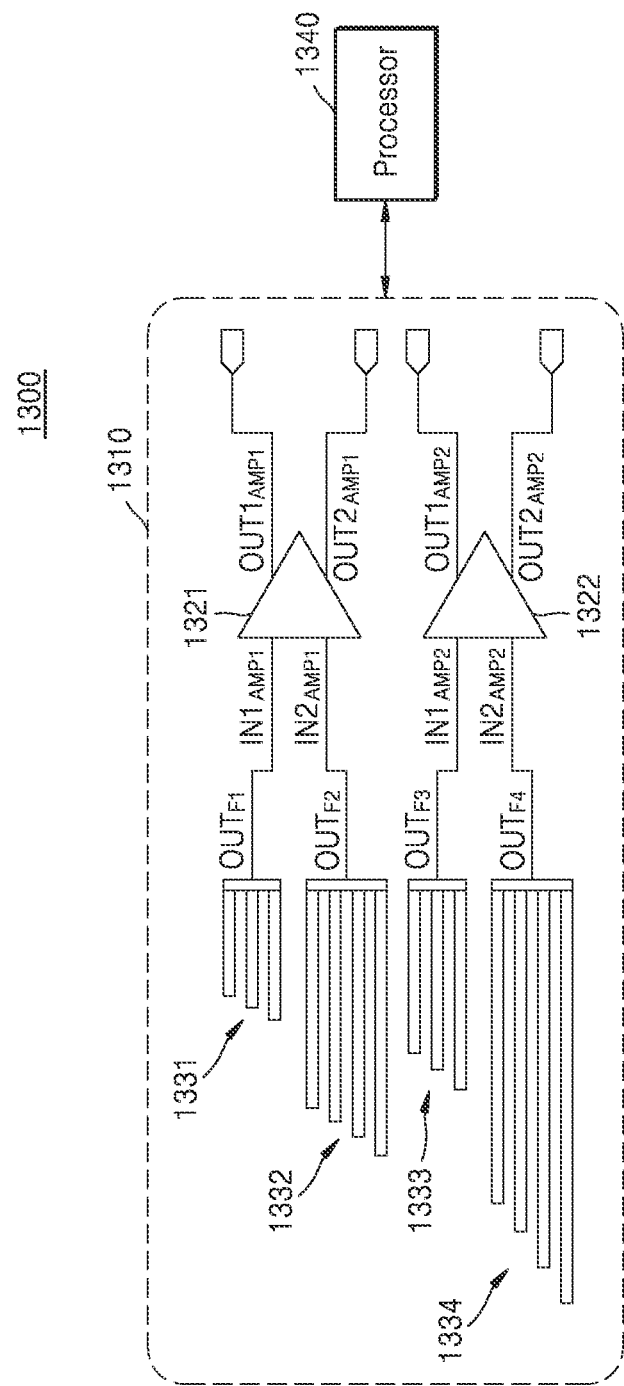
FIG. 13 is a diagram illustrating a sound processing device according to an example embodiment.

FIG. 13 is a diagram illustrating a sound processing device 1300 according to an example embodiment.

The sound processing device 1300 is a device that converts and processes a sound signal into an electrical signal, and may include a speaker, a microphone, an earphone, a bio device, a portable device, a TV, a vehicle device, an IoT device, etc., but is not limited thereto.

The sound processing device 1300 may include a sensor interface 1310 and a processor 1340 that processes an output signal of the sensor interface 1310.

In an example embodiment, the sensor interface 1310 includes four cantilever beam bundles 1331 to 1334 and two differential amplifiers 1321 and 1322. The cantilever beam bundles 1331 to 1334 and the differential amplifiers 1321 and 1322 may include the configurations and functions of the cantilever beam bundle and the differential amplifier described in the above embodiments, and thus redundant descriptions thereof will be omitted.

The cantilever beam bundles 1331 to 1334 may be configured to filter signals of different frequency bands. The order in which the cantilever beam bundles 1331 to 1334 are arranged may not be dependent on frequency bands of the signals filtered by the cantilever beam bundles 1331 to 1334. For example, when the sensor interface 1310 is configured to filter a sound signal in an audible frequency band in the range of about 20 Hz to about 20 kHz, the first cantilever beam bundle 1331 may be configured to filter a sound signal in a frequency band in the range of about 2 kHz to about 20 kHz, the second cantilever beam bundle 1332 may be configured to filter a sound signal in a frequency band in the range of about 100 Hz to about 1 kHz, the third cantilever beam bundle 1333 may be configured to filter a sound signal in a frequency band in the range of about 1 kHz to about 2 kHz, and the fourth cantilever beam bundle 1334 may be configured to filter a sound signal in a frequency band in the range of about 20 Hz to about 100 Hz.

According to example embodiments, the sensor interface 1310 may be configured as the sensor interface described above, for example, in FIG. 3.

The processor 1340 may be configured to process the output signal of the sensor interface 1310. The processor 1340 may be configured to select which output signal to process from an output signal through the first differential amplifier 1321 and an output signal through the second differential amplifier 1322.

The processor 1340 may be implemented as an array of a plurality of logic gates, and may be implemented as a combination of a general-purpose microprocessor and a memory in which a program executable in the microprocessor is stored. Further, the processor 1340 may include a filter for filtering the output signal.

It should be understood that embodiments described herein should be considered in a descriptive sense only and not for purposes of limitation. Descriptions of features or aspects within each embodiment should typically be considered as available for other similar features or aspects in other embodiments.

While example embodiments have been described with reference to the figures, it will be understood by those of ordinary skill in the art that various changes in form and details may be made therein without departing from the spirit and scope as defined by the following claims.

What is claimed is:

1. A sensor interface comprising:
   a first cantilever beam bundle comprising at least one resonator and a first output terminal;
   a second cantilever beam bundle comprising at least one resonator and a second output terminal; and
   a differential amplifier comprising a first input terminal electrically connected to the first output terminal of the first cantilever beam bundle and a second input terminal electrically connected to the second output terminal of the second cantilever beam bundle,
   wherein each of the at least one resonator of the first cantilever beam bundle and each of the at least one resonator of the second cantilever beam bundle comprises a sensor,
   wherein the sensor comprises an upper electrode, a piezoelectric material layer, and a lower electrode,
   wherein the upper electrode of the at least one resonator of the first cantilever beam bundle is electrically connected to the first input terminal of the differential amplifier, and
   wherein the lower electrode of the at least one resonator of the second cantilever beam bundle is electrically connected to the second input terminal of the differential amplifier.

2. The sensor interface of claim 1, wherein a resonance frequency of the at least one resonator of the first cantilever beam bundle is different from a resonance frequency of the at least one resonator of the second cantilever beam bundle.

3. The sensor interface of claim 1, wherein a frequency band of a signal filtered by the first cantilever beam bundle is different from a frequency band of a signal filtered by the second cantilever beam bundle.

4. The sensor interface of claim 1, wherein the sensor is configured to generate an electrical signal when the respective resonator vibrates.

5. The sensor interface of claim 1, wherein the upper electrode, the piezoelectric material layer, and the lower electrode have a same length.

6. The sensor interface of claim 1, wherein a length of one of the upper electrode, the piezoelectric material layer, and the lower electrode is different from lengths of remaining ones of the upper electrode, the piezoelectric material layer, and the lower electrode.

7. The sensor interface of claim 1, wherein each of the at least one resonator of the first cantilever beam bundle and each of the at least one resonator of the second cantilever beam bundle comprises a support member configured to vibrate based on sound, and
   wherein the lower electrode is disposed on the support member.

8. The sensor interface of claim 7, wherein a length of the support member of the at least one resonator of the first cantilever beam bundle and a length of the support member of the at least one resonator of the second cantilever beam bundle are same.

9. The sensor interface of claim 7, wherein the support member is a cantilever.

10. The sensor interface of claim 7, wherein each of the at least one resonator of the first cantilever beam bundle and each of the at least one resonator of the second cantilever beam bundle comprises a fixing member configured to fix one end of the support member.

11. The sensor interface of claim 10, wherein a length of the fixing member of the at least one resonator of the first cantilever beam bundle and a length of the fixing member of the at least one resonator of the second cantilever beam bundle are different from each other.

12. The sensor interface of claim 1, wherein the differential amplifier comprises a first output terminal and a second output terminal.

13. The sensor interface of claim 12, wherein the differential amplifier comprises at least one circuit element electrically connected to the first input terminal and the first output terminal, and
    wherein the first input terminal is a positive input terminal and the first output terminal is a negative output terminal, or the first input terminal is a negative input terminal and the first output terminal is a positive output terminal.

14. The sensor interface of claim 13, wherein the at least one circuit element is one of a resistor, a capacitor, and a diode.

15. The sensor interface of claim 1, further comprising:
    at least one circuit element electrically connected to the first output terminal of the first cantilever beam bundle and the first input terminal of the differential amplifier.

16. The sensor interface of claim 1, wherein the first cantilever beam bundle comprises a plurality of resonators,
    wherein each of the plurality of resonators comprises a support member, and
    wherein the support members of the plurality of resonators have same length and are configured to vibrate based on sound.

17. A sound processing device comprising:
    a sensor interface, the sensor interface comprising:
      a first cantilever beam bundle comprising at least one resonator and a first output terminal;
      a second cantilever beam bundle comprising at least one resonator and a second output terminal; and
      a differential amplifier comprising a first input terminal electrically connected to the first output terminal of the first cantilever beam bundle and a second input terminal electrically connected to the second output terminal of the second cantilever beam bundle; and
    a processor configured to process an output signal of the sensor interface,
    wherein each of the at least one resonator of the first cantilever beam bundle and each of the at least one resonator of the second cantilever beam bundle comprises a sensor,
    wherein the sensor comprises an upper electrode, a piezoelectric material layer, and a lower electrode,
    wherein the upper electrode of the at least one resonator of the first cantilever beam bundle is electrically connected to the first input terminal of the differential amplifier, and
    wherein the lower electrode of the at least one resonator of the second cantilever beam bundle is electrically connected to the second input terminal of the differential amplifier.

18. A sensor interface comprising:
    a first cantilever beam bundle comprising a plurality of resonators and a first output terminal;
    a second cantilever beam bundle comprising a plurality of resonators and a second output terminal; and
    a differential amplifier comprising a first input terminal electrically connected to the first output terminal of the first cantilever beam bundle and a second input terminal electrically connected to the second output terminal of the second cantilever beam bundle, wherein a first frequency band of a signal filtered by the first cantilever beam bundle is different from a second frequency band of a signal filtered by the second cantilever beam bundle, wherein each of the at least one resonator of the first cantilever beam bundle and each of the at least one resonator of the second cantilever beam bundle comprises a sensor, wherein the sensor comprises an upper electrode, a piezoelectric material layer, and a lower electrode, wherein the upper electrode of the at least one resonator of the first cantilever beam bundle is electrically connected to the first input terminal of the differential amplifier, and wherein the lower electrode of the at least one resonator of the second cantilever beam bundle is electrically connected to the second input terminal of the differential amplifier.

* * * * *